(12) United States Patent
Yumshtyk et al.

(10) Patent No.: US 8,741,115 B2
(45) Date of Patent: Jun. 3, 2014

(54) SPUTTERING DEVICES AND METHODS

(75) Inventors: Gennady Yumshtyk, Maple (CA); Dmitri Ivanov, Toronto (CA)

(73) Assignee: BH5773 Ltd, Hollywood, FL (US)

( * ) Notice: Subject to any disclaimer, the term of this patent is extended or adjusted under 35 U.S.C. 154(b) by 1076 days.

(21) Appl. No.: 12/370,106

(22) Filed: Feb. 12, 2009

(65) Prior Publication Data

US 2009/0145743 A1 Jun. 11, 2009

Related U.S. Application Data

(62) Division of application No. 11/082,208, filed on Mar. 16, 2005, now abandoned.

(51) Int. Cl.
*C23C 14/34* (2006.01)

(52) U.S. Cl.
USPC ............ 204/298.16; 204/298.12; 204/297.17; 204/298.2; 204/298.21; 204/298.22

(58) Field of Classification Search
USPC ........................................ 204/192.12, 298.26
See application file for complete search history.

(56) References Cited

U.S. PATENT DOCUMENTS

| | | | |
|---|---|---|---|
| 3,976,031 A * | 8/1976 | Itoh .............................. | 118/629 |
| 4,031,424 A | 6/1977 | Penfold et al. | |
| 4,179,351 A | 12/1979 | Hawton, Jr. et al. | |
| 4,221,652 A | 9/1980 | Kuriyama | |
| 4,356,073 A | 10/1982 | McKelvey | |
| 4,374,722 A | 2/1983 | Zega | |
| 4,376,025 A | 3/1983 | Zega | |
| 4,407,713 A | 10/1983 | Zega | |
| 4,418,645 A | 12/1983 | Knights | |
| 4,422,916 A | 12/1983 | McKelvey | |
| 4,500,409 A | 2/1985 | Boys et al. | |
| 4,622,121 A | 11/1986 | Wegmann et al. | |
| 4,824,540 A * | 4/1989 | Stuart ....................... | 204/192.12 |
| 4,904,362 A | 2/1990 | Gaertner et al. | |

(Continued)

FOREIGN PATENT DOCUMENTS

| JP | 52-095581 | | 8/1977 |
|---|---|---|---|
| JP | 55-027627 | | 2/1980 |
| JP | 55-069256 | | 5/1980 |
| JP | 09115733 A | * | 5/1997 |

OTHER PUBLICATIONS

International Search Report, Corresponding to International Application No. PCT/US06/09148, Mailed Aug. 2, 2007.

(Continued)

*Primary Examiner* — Keith Hendricks
*Assistant Examiner* — Jason M Berman
(74) *Attorney, Agent, or Firm* — Lathrop & Gage LLP

(57) ABSTRACT

The invention provides devices and methods for depositing uniform coatings using cylindrical magnetron sputtering. The devices and methods of the invention are useful in depositing coatings on non-cylindrical workpiece surfaces. An assembly of electromagnets located within the bore of a hollow cylindrical emitter is used to form a magnetic field exterior to and near the exterior surface of the emitter. The magnet assembly configuration is selected to provide a magnetic field configuration compatible with the workpiece surface contour. The electromagnet assembly may be a plurality of magnet units, each unit having at least one electromagnet. The magnetic field strength from each magnet unit is separately and electrically adjustable. Each electromagnet in the assembly has a coil of electrically conducting material surrounding a specially shaped core of magnetic material.

26 Claims, 6 Drawing Sheets

(56) References Cited

U.S. PATENT DOCUMENTS

| | | |
|---|---|---|
| 4,957,605 A | 9/1990 | Hurwitt et al. |
| 5,174,875 A | 12/1992 | Hurwitt et al. |
| 5,417,833 A | 5/1995 | Harra et al. |
| 5,518,597 A | 5/1996 | Storer et al. |
| 6,193,853 B1 | 2/2001 | Yumshtyk et al. |
| 6,365,011 B1 | 4/2002 | Yumshyyk |
| 6,436,252 B1 | 8/2002 | Tzatzov et al. |
| 6,767,436 B2 | 7/2004 | Wei |

OTHER PUBLICATIONS

International Preliminary Report on Patentability, Corresponding to International Application No. PCT/US06/09148, Mailed Jun. 5, 2008.

Thorton et al. (1978) "Cylindrical Magnetron Sputtering," In; *Thin Film Processes*, Academic Press Inc., pp. 75-113.

Written Opinion, Corresponding to International Application No. PCT/US06/09148, Mailed Aug. 2, 2007.

\* cited by examiner

SPUTTERING DEVICES AND METHODS

CROSS-REFERENCE TO RELATED APPLICATIONS

This application is a division of U.S. patent application Ser. No. 11/082,208, filed Mar. 16, 2005, which is hereby incorporated by reference in its entirety.

BACKGROUND OF THE INVENTION

The present invention relates to methods and devices for applying coatings by cylindrical magnetron sputtering, in particular devices and methods where a magnetic field is created by an assembly of electromagnets.

Magnetron sputtering processes are classified as planar or cylindrical. The planar (circular, rectangular and triangular shaped) magnetron sputtering devices generally suffer from non-uniform erosion, with the area of maximum erosion in the shape of a racetrack centered around the magnet position, rendering the target unusable after use, even while relatively large amounts of useful target material still remain. Also, planar magnetrons often employ large magnet assemblies, which are not useful for creating films inside structures with hollow workpieces having annular cavities, such as narrow diameter pipes.

Several different types of cylindrical magnetron sputtering devices have been developed, as disclosed and summarized by Thornton et al., "Cylindrical Magnetron Sputtering", 1978 Academic Press, Inc., pp. 75-113. Cylindrical magnetron sputtering devices are used to coat cylindrical workpieces, such as the inside surfaces of pipes. Basically, the target material in a cylindrical magnetron sputtering device is in the form of an elongated tube.

U.S. Pat. No. 4,031,424, issued to Penfold, describes solenoid coil configurations used to provide a confining magnetic field around a hollow cathode having a cylindrical barrel and end flanges. In one configuration, the workpiece is placed inside the cathode and the solenoid coil(s) are placed outside the cathode. In another configuration, the workpiece is placed outside the cathode in a vacuum chamber. One solenoid coil winding is disposed about the outer wall of the vacuum chamber and another solenoid coil winding is disposed within the cathode. Both arrangements are stated to employ a magnetic field whose lines are generally parallel to the axis of the cathode barrel. Externally positioned solenoid coils are not useful for coating the surfaces of ferrous pipes since externally positioned coils magnetize the workpieces creating magnetic shields, and complicate the deposition process, especially when coating pipes with non-constant wall thickness or tapered inside diameter.

U.S. Pat. No. 4,376,025 issued to Zega orients the magnetic flux lines circularly around the axis of the elongated rod-like target material, as opposed to the axial orientation used by Penfold. Zega describes a cylindrical magnetron device utilizing a tubular current-carrying anode disposed within a tubular target cathode. The disadvantage of this approach is that, while very efficient with small diameter targets, it becomes less efficient as the target diameter increases. Further disadvantages of this high current approach are the considerable additional power input needed for the large diameter/high electrical resistance target and practical limitations of the system to uniformly coat non-cylindrical, or tapered inside surfaces of elongated components.

U.S. Pat. No. 4,407,713 issued to Zega describes a magnetron sputtering device which creates a magnetic field with an assembly of permanent magnets. The magnet assembly consists of a plurality of equiangularly spaced axially extending radially magnetized magnets arranged in such a manner that their flux lines form over the sputtering face a plurality of equiangularly spaced axially extending straight arch portions connected to each other by arcuate arch end-portions, whereby defining at least one closed-loop arch over the sputtering face. The magnetic assembly may be axially rotated relative to the target. The device is cumbersome for use in small diameter pipes and has little application for hollow workpieces having complex shapes.

Alternative cylindrical sputtering devices are disclosed in U.S. Pat. No. 4,221,652 to Kuriyama, and in U.S. Pat. No. 4,179,351 to Hawton et al. In both devices, a cylindrical cathode comprising the material to be deposited is placed within a substantially cylindrical workpiece. Within the cylindrical cathode are one or more cylindrical magnets oriented symmetrically about the axis of the cylinder for generating a toroidal magnetic field. The cathode surface is located in close proximity of the magnet poles such that magnetic field lines penetrate the cathode and form a closed ring gap. Within the cylindrical cathode also exists a pipeline for introducing a coolant. The multiple permanent magnets produce multiple toroidal volumes or particle racetracks, in which the charged particles are concentrated. This results in multiple erosion zones, each zone being centered upon the center of a magnet, rather than in a single erosion zone, as would be obtained from a single magnet. U.S. Pat. No. 4,221,652 describes movement of a single magnet along the axis of the target to obtain uniformity in thickness of a metallic film deposited on a workpiece.

The figures of JP Patent Publication No. 55-27627, corresponding to JP Patent 52095581 A, listing inventors Misumi, Takashi and Hosokawa, Naokichi also illustrate one or more magnets within a sputtering target. Movement of the magnet (s) within the target is indicated.

U.S. Pat. Nos. 4,356,073 and 4,422,916, issued to McKelvey, describe rotatable magnetron sputtering apparatus where magnetic means are mounted within a tubular cathode. The magnets described are U-shaped permanent magnets.

U.S. Pat. No. 4,904,362 issued to Gaertner et al. describes a cathode arrangement having an internal, cooled permanent magnet system. The permanent magnets inside the target are cut so that their end faces are at an angle of 45 degrees to 75 degrees to the longitudinal axis of the cathode arrangement and are magnetized so that their poles lie in the end faces. The magnets are disposed so like poles are adjacent. Rotation of the magnets causes rotation of the plasma zones. The surfaces to be sputtered are subjected to a mutual relative motion in the longitudinal direction of the cathode arrangement or carrier tube. The disadvantage of the apparatus described by Gaertner et al is use of magnets with constant, un-adjustable magnetic field and relatively complicated design of the permanent magnet assembly.

U.S. Pat. No. 6,436,252 issued to Tzatzov et al. describes a cathode assembly for magnetron sputtering of a cylindrical workpiece which assembly includes a magnet package consisting of a plurality of spaced permanent magnets of alternating polarity. The magnets may be joined with ferromagnetic spacers. The magnet package is positioned on the inside of the cathode such that a driving force applied to the magnet package or to the cathode, or to both independently, imparts relative longitudinal movement between the magnet package and the cathode.

In summary, there is a still a need for an device that can be used to provide uniform coatings on the inside surfaces of tubular components such as tapered pipes, and do so with flexibility to apply the desired levels of magnetic field to specific areas on the cathode that correspond to the specific irregular internal surface of the elongated workpiece.

SUMMARY OF THE INVENTION

The invention provides an emitter assembly for cylindrical magnetron sputtering which is useful in producing coatings at high deposition rates. The coatings of the invention, when applied to non-cylindrical workpieces, have improved uniformity compared to coatings applied with methods which do not compensate for variations in emitter to workpiece distance. The coatings produced by the methods of the invention can be used for a variety of purposes, including improving wear or corrosion resistance and rebuilding of worn-out parts.

The coating can be sputtered onto either the interior or the exterior of a workpiece or concurrently sputtered onto both the interior and exterior surfaces of the workpiece. In an embodiment, the workpiece is elongate, having a greater length than width. The workpiece is external to the hollow cylindrical emitter and may be oriented vertically or horizontally. The emitter, also referred to herein as the target, is part of an emitter assembly. The emitter is elongate, having a greater length than width. The emitter assembly comprises a magnet assembly capable of providing a magnetic field external to the emitter and in the vicinity of the external surface of the emitter. The magnet assembly comprises a plurality of electromagnets.

The invention provides an emitter assembly suited for sputter deposition of coatings on cylindrical and non-cylindrical workpiece surfaces. Examples of non-cylindrical workpiece surfaces, include, but are not limited to, tapered surfaces or surfaces having cavities. A workpiece surface which is non-cylindrical as a whole can have one or more sections which are cylindrical. For example, a tube may have an inner surface with a cylindrical portion connected to a tapered portion.

In the present invention, the longitudinal axis of the workpiece is parallel to the longitudinal axis of the emitter. In this configuration, the distance between the cylindrical surface of the emitter and a non-cylindrical workpiece surface is not constant along the length of the workpiece. One way to improve the coating uniformity for such a surface is to adjust the strength of the magnetic field along the length of the emitter to compensate for differences in emitter-to-workpiece distance. For example, a stronger magnetic field can compensate for more distant workpiece surfaces. In general, the magnetic flux produced by the assembly is affected by the number of turns in each electromagnet coil, the current supplied to each coil, the polarity of each coil, the distance between the coils, and the core material. Each of these factors can be independently controlled to tailor the coating deposition to the workpiece surface.

In an embodiment, the invention provides an emitter assembly comprising a magnetic assembly comprising a plurality of magnet units, each magnet unit comprising at least one electromagnet. The magnetic field from each magnet unit is separately and electrically adjustable. Electrical adjustment of the field from each magnet unit permits convenient adjustment of the magnetic field along the emitter. In comparison, to adjust the magnetic field along the emitter of a magnet assembly using permanent magnets either magnets must be replaced and/or the magnet configuration modified. The ability to electrically adjust the field of separate magnet units allows faster optimization of coating conditions for a given workpiece shape. The emitter assemblies of the present invention can also allow convenient reconfiguration of the magnet assembly for different workpiece shapes or dimensions. The magnet assemblies of the present invention are also capable of providing a stronger magnetic field than a permanent magnet assembly, especially for an emitter with a relatively small inner diameter.

In this embodiment, the invention provides an emitter assembly for magnetron sputtering a coating onto a workpiece surface, the emitter assembly comprising:
 a. an elongate cylindrical emitter having a longitudinal axis, the emitter being in the form of a tube having an inner bore;
 b. a magnet assembly capable of providing a magnetic field exterior to the emitter, the magnet assembly having two ends and being located within the inner bore of the emitter, the magnetic assembly comprising at least one magnet unit, the magnet unit comprising at least one electromagnet, where the number of magnet units and the number of electromagnets in each magnet unit is selected so that the magnet assembly comprises a plurality of electromagnets, and at least one nonmagnetic spacing connector between neighboring electromagnets;
 c. at least one adjustable source of electrical current, the number of current sources being equal to the number of magnet units, each current source being connected to a different magnet unit; and
 d. at least one nonmagnetic end connector at each end of the magnet assembly.

In an embodiment, the emitter assembly of the invention contains an assembly of electromagnets whose longitudinal axes are aligned with that of the emitter. Each of the electromagnets in the assembly comprises an electrically-conductive coil and a specially-shaped magnetic core. The core of the electromagnet is "dumbbell"-shaped, with a central portion and two end portions whose maximum diameter is larger than that of the central portion. The coil is located around the central portion of the dumbbell. The magnetic flux generated by flow of current through the coil is transmitted to the two end portions of the dumbbell outside the coil. The electromagnets are spaced so that the magnetic cores are not in contact with each other.

In an embodiment, the invention provides an emitter assembly for magnetron sputtering comprising:
 a. an elongate cylindrical emitter having a longitudinal axis, the emitter being in the form of a tube having an inner bore;
 b. a magnet assembly having two ends, the magnet assembly being located within the inner bore of the emitter, the magnet assembly comprising:
    a plurality of electromagnets, each electromagnet comprising an electrically conductive coil and a hollow core of magnetic material, the longitudinal axis of the coil and core lying along the longitudinal axis of the emitter and the core having a central portion around which the coil is located and two end portions, the maximum diameter of each end portion being equal to or greater than the outer diameter of the central portion.
    at least one nonmagnetic spacing connector between neighboring electromagnets; and
 c. at least one nonmagnetic end connector at both ends of the magnetic assembly.

The invention also provides a method for applying a coating onto the interior surface of a hollow elongate workpiece. In this embodiment, the method comprises the steps of
 a. providing an emitter assembly of the present invention;
 b. positioning the emitter assembly within the workpiece so that the longitudinal axis of the emitter is coaxial with the longitudinal axis of the workpiece;

c. providing a low pressure environment containing a sputtering gas exterior to the emitter and interior to the workpiece;

d. creating a plasma field between the emitter and the workpiece; and e. creating a magnetic field around the emitter by flowing current through the electromagnets of the magnet assembly.

The invention also provides a method for applying a coating onto the exterior surface of an elongate workpiece comprising the steps of:

a. providing an emitter assembly of the present invention;

b. placing the emitter assembly so that the longitudinal axis of the emitter is parallel to the longitudinal axis of the workpiece;

c. providing a low pressure environment containing a sputtering gas exterior to the emitter and the workpiece;

d. rotating the workpiece about its longitudinal axis;

e. creating a plasma field between the emitter and the workpiece; and f. creating a magnetic field around the emitter by flowing current through the electromagnets of the magnet assembly.

In the coating methods of the invention, the plasma and magnetic field strengths are sufficient to form sputtering gas ions which are capable of sputtering the emitter material.

In an embodiment where the workpiece surface is not cylindrical, the configuration of the magnet assembly and the current supplied to the magnet assembly is selected to provide a magnet field compatible with the contour of the workpiece surface. In an embodiment, the magnet assembly is moved longitudinally relative to the emitter during sputtering to compensate for longitudinal variations in magnetic field strength. In another embodiment, the workpiece is heated. The workpiece may also be subjected to a tensioning force to prevent warping as a result of the heat.

DETAILED DESCRIPTION OF THE INVENTION

Figure 1:
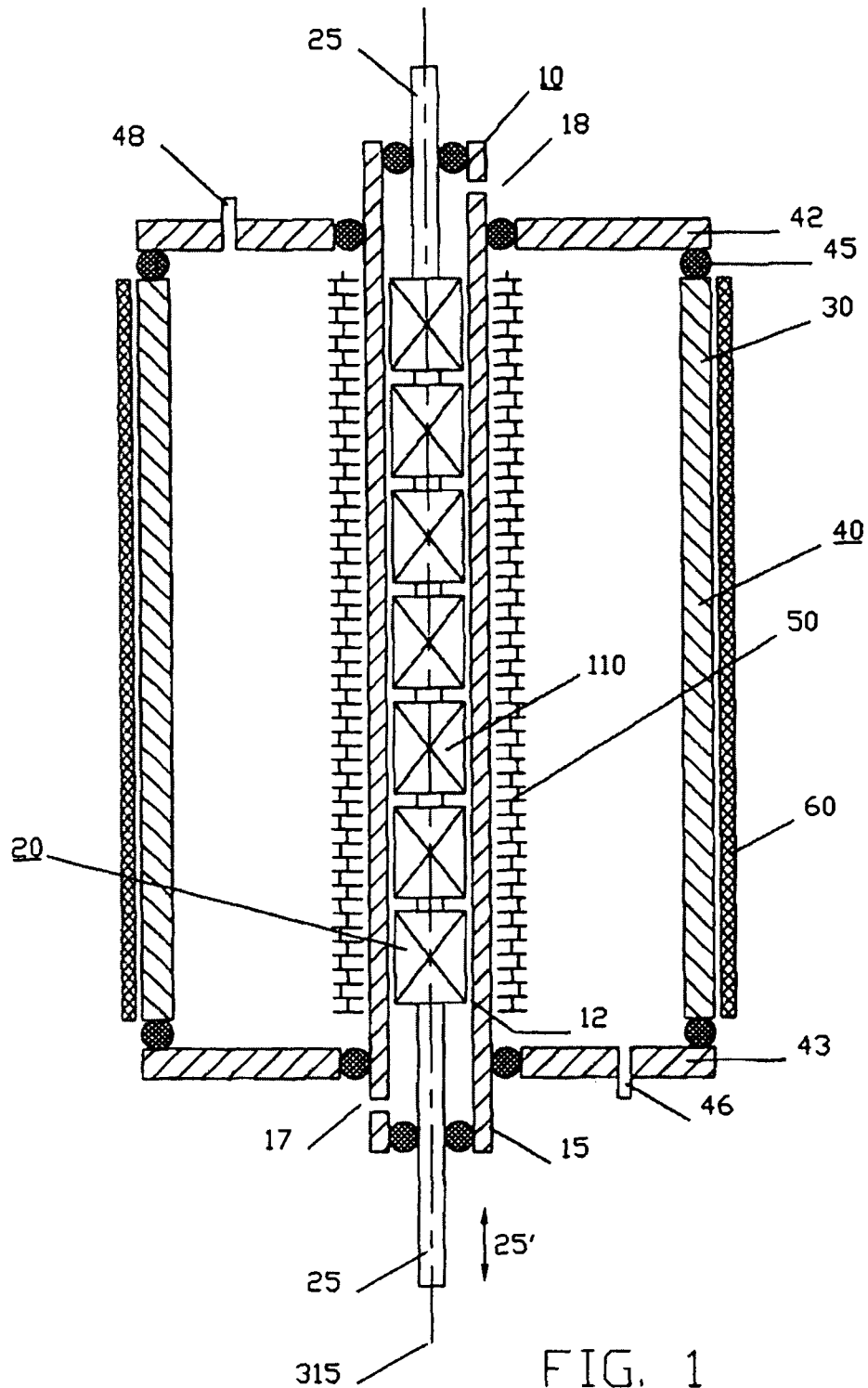
FIG. 1 is a schematic cross-sectional view of a sputtering apparatus for applying a coating to the interior of a workpiece.

The methods of the invention employ a specially designed magnet assembly within a hollow emitter to sputter a coating on either the interior or the exterior surface of a workpiece. The specially designed magnet assembly comprises a plurality of electromagnets, each electromagnet being spaced apart from its neighbor(s). In the following description of the drawings, like reference numerals indicate like elements. As used herein, sputtering extends to all types of sputtering and combinations thereof, including DC or pulse (for example, AC) magnetron sputtering at a wide range of frequencies, including RF sputtering, which uses a radio frequency (RF) field in the reduced pressure chamber. As well, sputtering extends to reactive sputtering.

Figure 5:
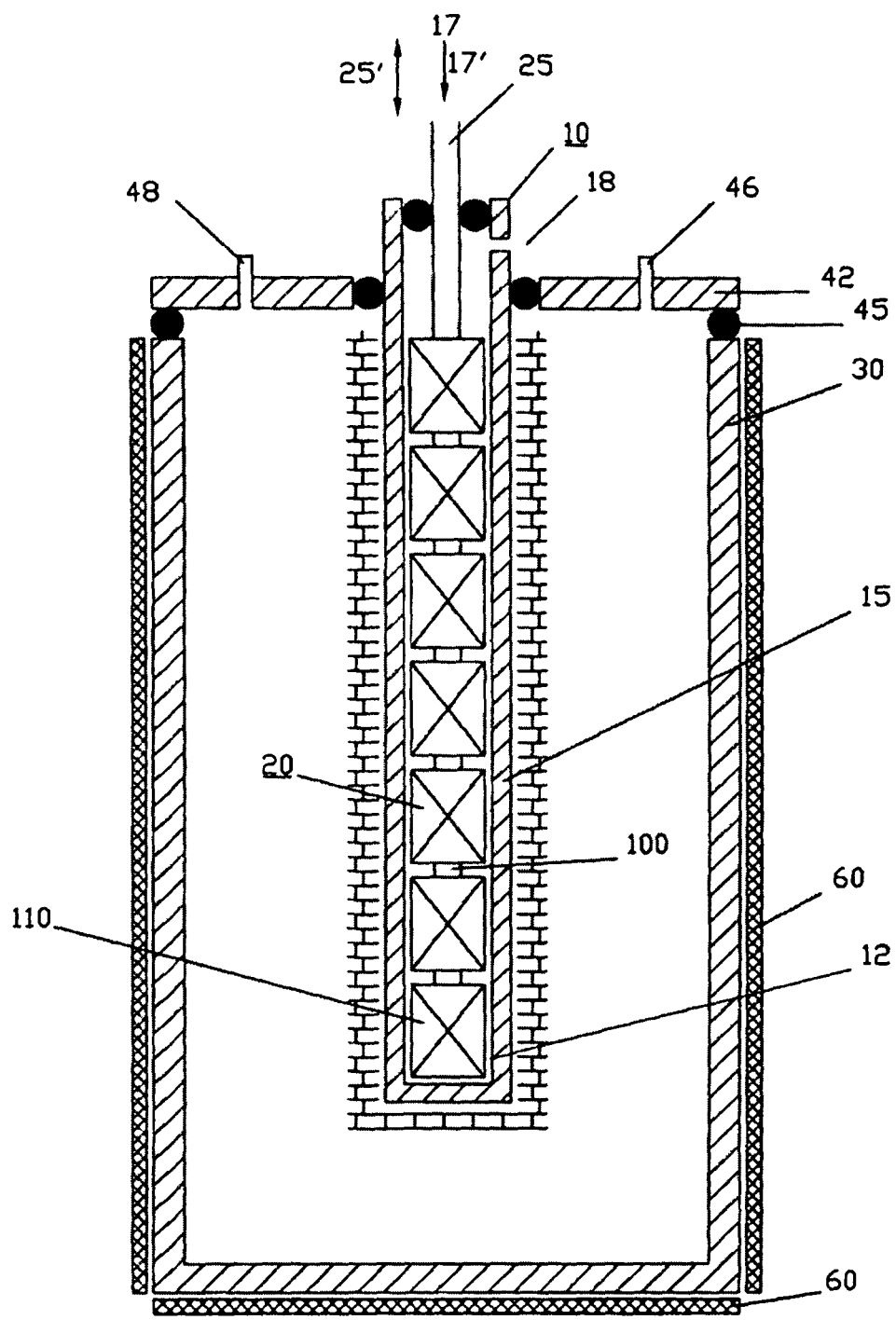
FIG. 5 is a schematic cross-sectional view of a coating apparatus for coating a workpiece with a closed end.

FIG. 1 schematically illustrates a sputtering apparatus of the present invention for applying a coating to the interior of a workpiece. In this embodiment, the workpiece is in the form of a tube which is symmetric about its longitudinal axis. As used herein, a tube is an elongated hollow body which may or may not have a constant diameter along the length of the body. For example, a tube may be have an inner surface which is cylindrical, tapered, or has a shape similar to that formed by a bellows. The work piece may be open ended or closed at one end, as shown in FIG. 5.

The emitter assembly (10) comprises an emitter (15) and magnet assembly (20). The emitter (15) is a tube having an interior bore. In a preferred embodiment, the emitter (15) is cylindrical tube. In an embodiment, the emitter (15) does not have a flanged configuration similar to that described in U.S. Pat. No. 4,031,424 to Penfold et al. The emitter material is selected so that it is not appreciably magnetized by the field from the magnet assembly. The emitter may be a commodity grade tube of the coating material. Suitable coating materials are well known for many different applications such as corrosion protection, erosion or physical wear protection. Titanium, stainless steel or aluminum along with other conducting, semi-conducting or insulating materials may be utilized as the coating material. The emitter may comprise a core which is itself coated with a deposition of the coating material by thermal spraying, electroplating and dense wire winding, or any other material bonding methods known to those skilled in the art. When the workpiece is open-ended, the length of the emitter is generally greater than or equal to the length of the workpiece. When the workpiece has a closed end, the emitter may have a closed end as well and the length of the emitter may be shorter than or equal to the length of the workpiece as shown in FIG. 5. In different embodiments, the emitter diameter is between about 0.5" and about 12", between about 0.5" and about 5", and between about 0.5" and about 2".

The magnet assembly (20) is located within the interior bore of emitter (15) so that the longitudinal axis of the magnet assembly is coincident with the longitudinal axis of the emitter. In FIGS. 1,2,5, and 6, individual electromagnets (110) are symbolized by rectangular boxes containing an X and the details of the electromagnet core are not shown. The magnet assembly does not extend into the emitter wall. As shown in FIG. 1, a gap (12) may be present between the magnet assembly and the interior surface of the emitter. Such a gap eases longitudinal movement of the magnet assembly within the emitter and allows fluid cooling of the emitter assembly. In FIG. 1, the ends of magnet assembly (20) contact end connectors (25). The connectors are electrically insulating. The ends of the magnet assembly are the outer ends of cores of the outer electromagnets in the magnet assembly. The magnet assembly and end connectors can be moved longitudinally; the double headed arrow (25') near the lower end connector in FIGS. 1 and 2 indicates such back and forth movement.

In this embodiment, the emitter assembly is placed within the workpiece (30), which forms part of a reduced pressure chamber (40). FIG. 1 shows a reduced pressure chamber further comprising end plates (42, 43) fitted to the open ends of the workpiece (30) with o-ring gaskets (45). Preferably, the longitudinal axis of the emitter is coincident with the longitudinal axis of the workpiece. In FIG. 1, the longitudinal axis of the emitter (315) is coincident with the longitudinal axes of the workpiece and the magnet assembly. In FIG. 1, o-ring gaskets (45) also form a vacuum seal between the end plates (42, 43) and the emitter (15) and the connectors (25) and emitter (15).

During sputter deposition, a low pressure environment is provided within the reduced pressure chamber (40). For the configuration shown in FIG. 1, the low pressure environment is external to the emitter and internal to the workpiece. As used herein, a low pressure environment has a pressure around or less than $10^{-3}$ torr. To produce the required pressure, the reduced pressure chamber is connected to a source of vacuum (not shown). In FIG. 1, the connection is made through discharge (46). Any type of vacuum pump known in the art that is capable of attaining the required pressure may be used.

During sputter deposition, sputtering gas is also introduced into the reduced pressure chamber (40). In FIG. 1, the connection between the reduced pressure chamber (40) and the source of sputtering gas (not shown) is made through gas inlet (48). Suitable sputtering gases include inert gases such as argon.

During sputtering, a source of electrical power (not shown) is used to create a plasma field between the emitter (15) and the workpiece (30). The emitter acts as the cathode. This source of electrical power used to create the plasma field may be a high voltage power source or any other suitable power source known to one skilled in the art of sputter deposition.

At least one source of electrical current (not shown) is used to produce flow of current through the electromagnets of the magnet assembly, thereby generating a magnetic field. In an embodiment, the source of electrical current is adjustable. In an embodiment, the source of electrical current is a low current power supply. As used herein, a low current power supply is capable of supplying current in a range of 1 to 50 amps. In an embodiment, the source of electrical current is a direct current (DC) power supply.

In general, the area of overlap between the magnetic field and the plasma field defines one or more coating zones where enhanced sputtering of the emitter occurs. In FIG. 1, one coating zone (50) is shown.

In an embodiment, cooling fluid is circulated in the interior of the emitter assembly to remove heat generated by the electromagnets and cool the emitter during the highly energetic sputtering process. In FIG. 1, a cooling fluid inlet (17) and outlet (18) are provided in emitter (15). The gap (12) shown in FIG. 1 allows fluid flow between the outside of the magnet assembly (20) and the inside surface of the emitter (15). Fluid can also flow through the hollow cores of the electromagnets (110). Cooling fluid may be supplied to the emitter assembly by methods known to those skilled in the art. In an embodiment, the cooling fluid is water.

In an embodiment, the workpiece (30) is heated. It is known that the sputtered atoms emitted by the emitter (15) arrive at the workpiece (30) with sufficient energy that surface impurities may be driven off and the sputtered atom may penetrate into the lattice of the workpiece to generate a diffusion-type coating. If the workpiece is at an elevated temperature, the sputtered molecules may be more efficient in penetrating the lattice, thereby creating a better bond between the workpiece and the coating layer. In an embodiment, convection-type heater (60) is used to heat the workpiece.

In an embodiment, a tensioning force is applied to a heated workpiece. One problem that may occur when heating portions of an elongated workpiece is that the workpiece may warp as a result of uneven thermal expansion. Warping may be alleviated in part by orienting the workpiece vertically. Warping may be further alleviated by tensioning the workpiece. The tensioning force may be applied to support flanges affixed to both ends of the workpiece. For example, one support flange may be fixed and a load applied to the other support flange.

Figure 2:
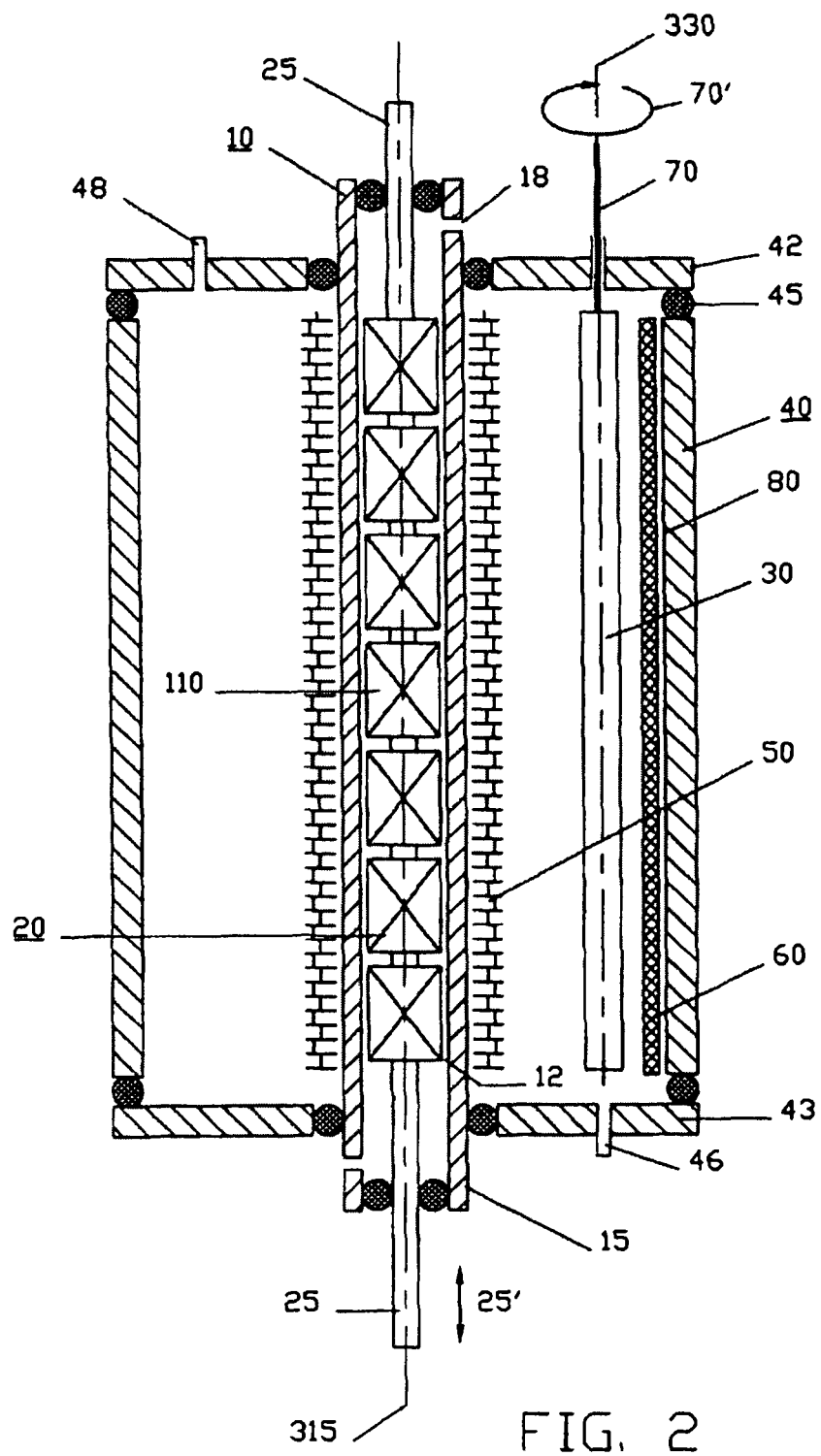
FIG. 2 is a schematic cross-sectional view of a sputtering apparatus for applying a coating to the exterior of a workpiece.

FIG. 2 is a schematic of a sputtering apparatus for applying a coating to the exterior of a workpiece. The workpiece shown is symmetric about its longitudinal axis. In this embodiment, the workpiece may or may not be hollow. If the workpiece is hollow, the ends of the workpiece can be temporarily sealed to prevent any deposition within the tube. In FIG. 2, the dashed vertical line (330) through the workpiece indicates the longitudinal axis of the workpiece.

In the embodiment shown in FIG. 2, the workpiece (30) does not form part of the reduced pressure chamber (40), but is located within the reduced pressure chamber. The reduced pressure chamber can be formed by end plates (42, 43) sealing a cylindrical side wall (80), as shown in FIG. 2. The low pressure environment is provided within the reduced pressure chamber as previously described, except that the reduced pressure environment is external to both the emitter and the workpiece.

In the embodiment where the external surface of the workpiece is coated, the longitudinal axis of the emitter (15) is parallel to the longitudinal axis of the workpiece (30). During coating, the workpiece is rotated about its longitudinal axis. FIG. 2 shows the workpiece attached to a workpiece connector (70), which is used to rotate the workpiece. The workpiece connector can pass through a conventional sealed fitting. The arrow (70') above workpiece connector (70) illustrates rotation of the workpiece connector about its longitudinal axis. In another embodiment, a plurality of workpieces can be coated with a central emitter which is external to each of the workpieces.

The placement of the magnet assembly within the emitter, cooling of the interior of the emitter assembly, provision of sputtering gas to the reduced pressure chamber, sources of electrical power for creation of the plasma and magnetic fields, and heating of the workpiece in this embodiment are as described for the embodiment of FIG. 1.

Figure 3:
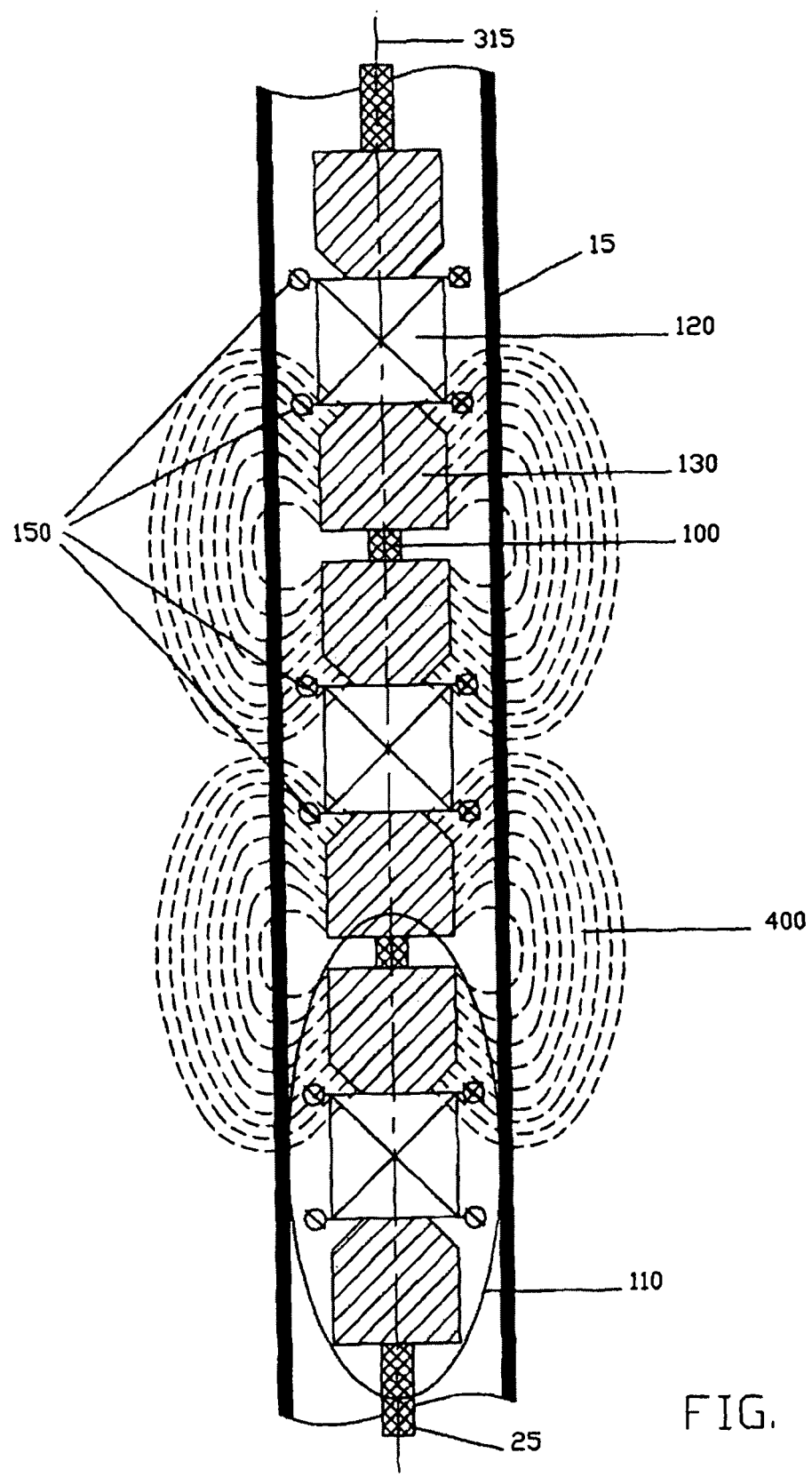
FIG. 3 is a schematic cross-sectional view of an emitter assembly of the present invention.

FIG. 3 schematically illustrates a cross-sectional view of an emitter assembly of the present invention. As shown in FIG. 3, the emitter comprises an emitter tube having an internal bore and a magnet assembly located within the internal bore of the emitter. As shown in FIG. 3, the magnet assembly comprises a plurality of electromagnets (110). The electromagnets are arranged so that the longitudinal axis of the electromagnet is coincident with the longitudinal axis of the emitter. Each electromagnet comprises an electrically conducting coil (120) and a magnetizable core (130). In FIG. 3, an oval has been drawn about the coil and core to indicate that electromagnet (110) includes both elements. In the embodiment shown in FIG. 3, the core of each electromagnet extends equally past both ends of the electromagnet coil. Each pair of neighboring electromagnets is separated by a spacing connector (100). In an embodiment, the spacing between the electromagnets is the same throughout the magnetic assembly. The electromagnets at the end of the assembly are in contact with end connectors (25). The spacing and end connectors are nonmagnetic and not electrically conductive. The spacing connectors do not conduct magnetic flux between neighboring electromagnets. The end connectors do not conduct magnetic flux from the electromagnets to which they are connected. The spacing connectors (100) and end connectors (25) allow movement of the magnet assembly as a unit. The connectors may be fastened to the cores of the electromagnets by any method known to the art, for example by threading or gluing. Suitable materials for the insulating connectors include, but are not limited to, nonmagnetic ceramics, plastics, etc.

Each electromagnet (110) comprises an electrically conducting coil (120) and a magnetizable core (130). In an embodiment, the coils and cores of all the electromagnets in the assembly are identical, such that each electromagnet would produce the same magnetic field if the same amount of current were to be flowed through the coil. FIG. 3 also indicates electrical connections (150) to the electromagnets (110). In addition, FIG. 3 indicates the lines of magnetic flux (400) formed when neighboring core ends have opposite polarity.

The electrically conducting coil may be formed from electrically conducting wire with an electrically insulating coating to prevent shorting between adjacent turns of wire and between the coil and the core. Electrically conducting tubing similarly coated can also be used to form the electrically conducting coil. The coil may be formed on a nonmagnetic mandrel or on the core itself. In an embodiment, the overall shape of the coil is cylindrical. Suitable materials for the conducting coil include copper, silver and other low electrical resistance materials suitable for use at the operating temperature of the electromagnets. As is known in the art, the magnetic field generated by an electromagnet containing a solenoid and a magnetic core is proportional to the relative permeability of the core material, the number of coils in the solenoid, and the current through the solenoid. In addition, for a solenoid the polarity of the magnetic field is determined by the direction of current flow. In particular, the north pole is associated with the end of the solenoid where the current exits the coil.

Figure 4A:
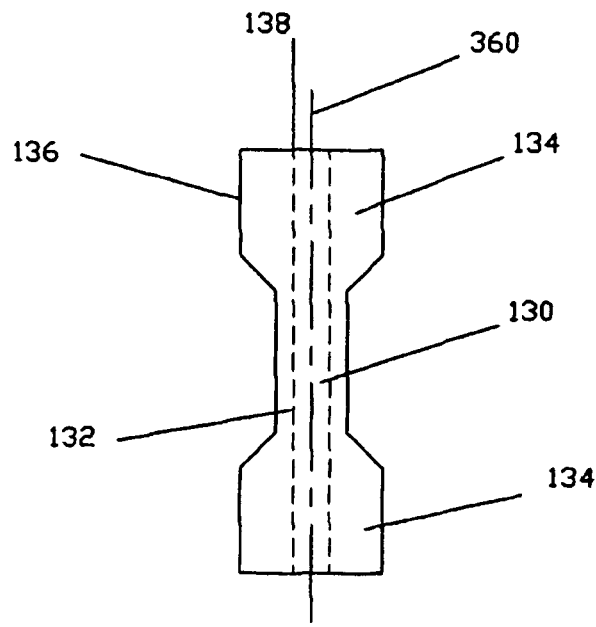
FIG. 4A is a side view of a magnetic core from a magnet assembly of the present invention.
Figure 4B:
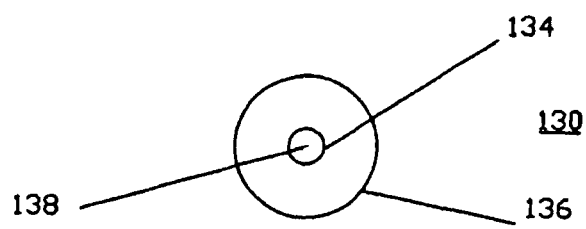
FIG. 4B is an end view of the magnetic core from FIG. 4A.

FIGS. 4A and 4B schematically illustrate a magnetic core (130) for use in the magnetic assembly of the present invention. As shown in the side view of FIG. 4A, the magnetic core (130) has a central portion (132) and two end portions (134). In an embodiment, the two end portions are symmetric, each having the same maximum diameter. In the embodiment shown in FIG. 4A, the core is elongate. Each end portion has an outer face (136). The electrically conducting coil (120, as shown in FIG. 3) is located around the central portion of the magnetic core. The two end portions are generally of larger diameter than the central portion. In particular, the maximum diameter of the end portion is larger than the maximum diameter of the central portion. In an embodiment, the maximum diameter of the end portions can also be greater than or equal to the outer diameter of the coil. In FIG. 4A, the central dashed line indicates the longitudinal axis of the core (360), while the neighboring dashed lines indicate the inner bore (138) of the core.

As shown in the end view of FIG. 4B, the magnetic core (130) is hollow with interior bore (138). The bore extends the length of the core. The hollow bore of the core allows efficient fluid cooling of the electromagnet. The hollow bore of the core also provides a passage for electrical connections.

The wall thickness of the core can be selected experimentally based on a balance between the following two factors: 1) it should be as massive as possible to provide higher magnetic flux for the field applied by the coil, and 2) it has to be thin enough for the magnetic field to fully saturate the core material. Usually thicker core walls are selected when higher magnetic fields are desired.

In an embodiment, the core is of soft magnetic material. As used herein, a soft magnetic material is a magnetic material which does not retain its magnetization when the magnetizing field is removed. Suitable materials for the magnetic core include, but are not limited to, Permalloy, mu-metal, or steel.

The portion of magnetic core affected by the magnetic field from the electrically conducting coil confines and significantly increases the magnetic flux created when current flows through the coil. The magnetic core also directs the resulting magnetic flux so that it exits the outer faces (136) of the end portions of the core. In an embodiment, the core is configured such that the flux primarily exits the outer faces, as illustrated in FIG. 3. In an embodiment, most of the length of the outer face (136) is parallel to the surface of the emitter. The smaller the gap (12 in FIGS. 1 and 2) between the outer faces and the interior surface of the emitter, the stronger the magnetic field at the outer surface of the emitter. The resulting magnetic field configuration is symmetric about the longitudinal axis of the emitter.

The magnetic assembly of the present invention generates a magnetic field with arched flux portions over the surface of the emitter, as illustrated in FIG. 3. Preferably, the magnetic field is sufficiently strong in the vicinity of the emitter surface that enhanced sputtering occurs. The magnetic field generated on the surface of the emitter can be shaped into any desired configuration to follow the contour of the workpiece for uniform coating coverage of tapered shapes, configurations with cavities and the like. Both the magnet assembly and the current supplied to the magnet assembly are selected to provide a magnetic field configuration compatible with the workpiece surface contour.

The magnet assembly is selected to provide a magnetic field configuration compatible with the workpiece surface contour. For example, it is beneficial to provide a greater magnetic field near the emitter surface for portions of the emitter which coat more distant portions of the workpiece surface than for portions of the emitter which coat less distant portions. The magnetic flux produced by the assembly can be affected by the number of turns in each electromagnet coil, the current supplied to each coil, the polarity of each coil, the distance between the coils, and the core material.

The current supplied to the magnet assembly is also selected to provide a magnetic field compatible with the contour of the workpiece surface. For example, all the coils can be connected to a common power supply so that the same current flows through each. This configuration is suitable for coating cylindrical workpiece surfaces.

In an embodiment suitable for coating non-cylindrical workpiece surfaces, the magnet assembly comprises a plurality of magnet units. Each magnet unit comprises at least one electromagnet. Each magnet unit is connected to a source of electrical current, and so the magnetic flux from each magnet unit is separately controllable. In an embodiment, each magnet unit comprises a single electromagnet so that each electromagnet is connected to its own power supply. In this configuration, the current flowing through each coil can be separately controlled. This configuration is suited for coating tapered work surfaces, since the magnetic field near the emitter surface can be incrementally increased or decreased along the length of the emitter by incrementally increasing or decreasing the current flow through subsequent coils.

In another embodiment, more than one electromagnet is connected to a given current source. Magnets connected to a common current source may be neighbors of one another. For example, adjacent magnets connected to a common power supply can be used for coating a section of the workpiece with a cylindrical surface. Non-neighboring magnets connected to a common current source can be used to coat a workpiece surface which has non-neighboring regions at about the same distance from the emitter.

The magnetic field configuration resulting from the magnet array also depends in part on the polarity of adjacent electromagnets. As used herein, when two electromagnets are connected in series, the adjacent poles of the two electromagnets are of opposite polarity (e.g. north pole adjacent to south pole). If the whole magnet assembly is connected in series, each adjacent pair of magnets is connected in series. If two electromagnets are connected in parallel, the adjacent poles of the two electromagnets have the same polarity.

In an embodiment, all the electromagnets in the magnet assembly are connected in series. In this embodiment, magnetic fields are found between the end portions of a given electromagnet, as well as between the cores of adjacent electromagnets. To coat a cylindrical workpiece, the electromagnets are preferably identical and the current through the electromagnets identical. To coat a workpiece having a tapered cross-section, the magnetic field can be increased over areas of the emitter corresponding to areas of the workpiece that are further away from the emitter. The magnetic field can be increased by supplying additional current to the electromagnets closest to these areas of the emitter, providing electromagnets with additional numbers of turns closest to these areas of the emitter, or by a combination of these two methods.

In another embodiment, all the electromagnets in the magnet assembly are connected in parallel. In this embodiment, magnetic fields are found between the end portions of a given electromagnet and are very insignificant between the cores of adjacent electromagnets. In this case, the magnetic flux is lower between the poles of adjacent electromagnets. This configuration can be suitable for depositing coatings on workpieces with a corrugated surface, such as bellows. The regions of the emitter with lower magnetic flux are aligned with areas of the workpiece which are closer to the emitter.

The configuration of the magnetic field from the magnet array also depends in part on the spacing between the electromagnets of the array. In an embodiment where the electromagnets of the magnet array have identical core and coil dimensions, the distance between the adjacent ends of adjacent cores is less than about one half the core length.

The magnetic field generated by the magnet assembly is symmetric about the longitudinal axis of the emitter, but is not uniform along the length of the emitter. To compensate for longitudinal nonuniformity in the magnetic field, the magnet assembly can be moved longitudinally within the emitter. In an embodiment, the magnet assembly is oscillated, or moved back and forth over a selected travel distance, during sputtering. In an embodiment where the electromagnets of the magnet array have identical core and coil dimensions, the travel distance is selected to be greater than or equal to the core length. If the electromagnets do not have identical core and coil dimensions, the travel distance is selected to be greater than or equal to the longest core length. Force may be applied to the magnet assembly to create relative longitudinal movement between the magnet assembly and the emitter by any method known to those skilled in the art.

FIG. 5 illustrates an embodiment for coating the interior surface of a workpiece (30) which is closed at one end. The emitter (15) is also closed at one end. In FIG. 5, label 17' indicates the flow of coolant into In the embodiment shown in FIG. 5, heat may be applied both around the workpiece and at the closed end of the workpiece.

In an embodiment, the invention provides a method for simultaneously coating the interior and exterior surfaces of a workpiece. The coating applied to the internal workpiece surface can be different in composition and/or thickness than that applied to the external surface of the workpiece.

Figure 6:
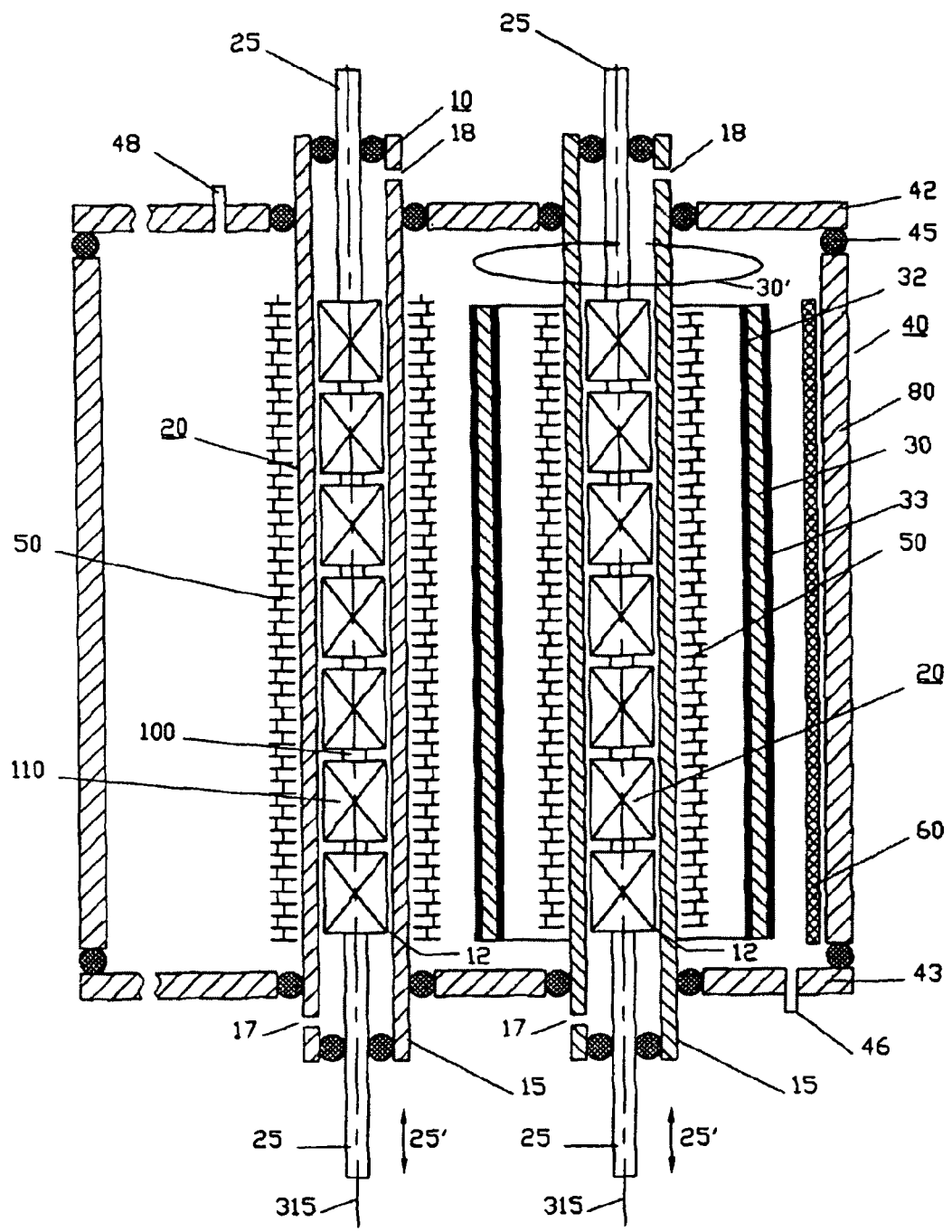
FIG. 6 is a schematic cross-sectional view of an apparatus containing two emitter assemblies for coating both the inside and outside of a tube.

FIG. 6 is a schematic cross-sectional view which illustrates how two emitter assemblies of the invention can be positioned to coat both the interior and exterior surfaces of a workpiece. As shown in FIG. 6, the emitter (15) used to coat the exterior surface of the workpiece (30) is placed external to the workpiece, with its longitudinal axis (315) parallel to longitudinal axis (330) of the workpiece. The emitter (15) used to coat the interior surface of the workpiece is placed inside the workpiece, with its longitudinal axis coincident with that of the workpiece. A plasma field is created between the external emitter and the workpiece and between the internal emitter and the workpiece. In addition, a magnetic field is created around each emitter as previously described. The workpiece is rotated to more evenly apply the coating, as indicated by arrow 30'. The workpiece may be rotated by any means known to the art, including a rotation feedthrough. As for the embodiment of FIG. 2, the workpiece may be heated by means of a convection-type heater external to the workpiece. In this figure, 32 indicates the interior coating and 33 the exterior coating. Different lengths can be coated on the interior and exterior of the workpiece by appropriate selection of the interior and exterior emitter assemblies.

The interior and exterior surfaces of a plurality of workpieces can be coated by providing a central emitter assembly which is exterior to each of the workpieces and an emitter assembly inside each of the workpieces. A plasma field is created between the external emitter assembly and each workpiece and between each internal emitter assembly and workpiece. A magnetic field is created around each emitter as previously described.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those devices and methods consisting essentially of and consisting of the recited components or elements. The invention illustratively described herein suitably may be practiced in the absence of any element or elements, limitation or limitations which is not specifically disclosed herein.

Whenever a range is given in the specification, for example, a range of dimensions, or a range of an electrical parameter, all intermediate ranges and subranges, as well as all individual values included in the ranges given are intended to be included in the disclosure.

Patents and publications mentioned in the specification are indicative of the levels of skill of those skilled in the art to which the invention pertains. All references cited herein are hereby incorporated by reference to the extent that there is no inconsistency with the disclosure of this specification.

One skilled in the art would readily appreciate that the present invention is well adapted to carry out the objects and obtain the ends and advantages mentioned, as well as those inherent therein. The devices and methods and accessory methods described herein as presently representative of preferred embodiments are exemplary and are not intended as limitations on the scope of the invention. Changes therein and other uses will occur to those skilled in the art, which are encompassed within the spirit of the invention, are defined by the scope of the claims.

EXAMPLES

Example 1

Coating Using a Magnet Assembly with Identical Coil Core Dimensions

In an embodiment, a workpiece at a distance between about 5 mm and about 50 mm from the emitter is coated using an assembly of electromagnets with identical coil and core dimensions. In this embodiment, suitable magnetic field strengths can be obtained with the number of turns in the coil between about 200 and about 500, the current to each coil between about 1 A and about 5 A, and a gap between the inner diameter of the emitter and the outer face of the electromagnet core between about 0.5 mm and about 1.5 mm. The distance between the adjacent core is between about 1 mm and about 10 mm. Deposition rates of 50 microns/hour are possible under these conditions.

The selection of the appropriate value can be done through a combination of experiments and calculations. For instance, one can easily calculate the magnetic field strength generated by a solenoid coil when the number of turns per unit length as well as the current supplied to this coil are known factors. The resulting magnetic flux generated by the core, although a function of the current supplied to the coil around that core, is usually determined experimentally. Adjustment of the output of an electromagnet to correspond to larger (D) or smaller (d) diameters of the workpiece is usually a simple proportional calculation. If there is a diameter difference, which is $X=D/d$, than the magnetic flux supplied current (or number of coil-turns) is adjusted by X to make that adjustment (the magnetic field is stronger when the distance is greater).

Example 2

Coating of the Interior of a Workpiece with a Diametrical Step

The workpiece has a diametrical step on its inner diameter (ID), with the larger ID being 75 mm and the smaller diameter being 50 mm. The emitter assembly has a constant emitter outer diameter (OD) of 25 mm. (i.e. Al tube with 25 mm OD). The workpiece is coated on the ID using an assembly of electromagnets with identical coil and core dimensions but connected to individual electromagnet power supplies. In this embodiment a group of coil/core assemblies positioned in the vicinity of and corresponding to the larger ID ($D1=75$ mm) of the workpiece is connected to a power source that supplies 5 A of current. Another group of coil/core assemblies, which is positioned adjacent to the first one but in the vicinity of and corresponding to the smaller ID ($D2=50$ mm) is connected to another power source that supplies 2.5 A of current. As a result, after approximately 1 hour of coating deposition the workpiece will have received a uniform coating in both regions (D1 and D2) of approximately 25 micrometers.

The invention claimed is:

1. A method for applying a sputtered coating onto the interior non-cylindrical surface of a hollow elongate workpiece, the workpiece having a longitudinal axis, the method comprising the steps of:
   a. providing an elongate emitter assembly, the emitter assembly comprising:
      i. an elongate cylindrical emitter having a longitudinal axis, the emitter being in the form of a tube having an inner bore;
      ii. a magnet assembly for providing a magnetic field exterior to the emitter, the magnet assembly having two ends and being located within the inner bore of the emitter, the magnet assembly comprising: at least one magnet unit, the magnet unit comprising at least one electromagnet, where the number of magnet units and the number of electromagnets in each magnet unit is selected so that the magnet assembly comprises a plurality of electromagnets; and at least one nonmagnetic spacing connector between neighboring electromagnets
         wherein each electromagnet comprises an electrically conductive coil and a hollow core of magnetic material, the longitudinal axis of the coil and core lying along the longitudinal axis of the emitter and the core having a central portion around which the coil is located and two end portions connected to the central portion, the maximum outer diameter of each end portion being greater than the outer diameter of the central portion, the outer diameter of each end portion being equal to the outer diameter of the central portion at the connection of each end portion to the central portion and each end portion being tapered towards the central portion adjacent to the connection of each end portion to the central portion;
      iii. at least one adjustable source of electrical current, the number of current sources being equal to the number of magnet units, each current source being connected to a different magnet unit; and
      iv. at least one nonmagnetic end connector at each end of the magnet assembly;
   b. positioning the emitter and the magnet assembly of the emitter assembly within the workpiece so that the longitudinal axis of the emitter is coaxial with the longitudinal axis of the workpiece;
   c. providing a low pressure environment containing a sputtering gas exterior to the emitter and interior to the workpiece;
   d. creating a plasma field between the emitter and the workpiece; and;
   e. creating a magnetic field exterior to the emitter by flowing current through the electromagnets of the magnet assembly to create a magnetic flux which primarily exits the outer faces of the end portions of the cores of the electromagnets, wherein the magnet assembly configuration and the current supplied to each magnet unit is selected to provide a magnetic field configuration compatible with the workpiece surface contour.

2. The method of claim 1, wherein the magnet assembly is moved longitudinally relative to the emitter such that the magnet assembly moves back and forth over a selected travel distance.

3. The method of claim 2, wherein the selected travel distance is greater than the length of the longest core in the assembly.

4. A method for applying a coating onto the interior surface of a hollow elongate workpiece, the workpiece having a longitudinal axis, the method comprising the steps of:
   a. providing an elongate emitter assembly; the emitter assembly comprising
      i. an elongate cylindrical emitter having a longitudinal axis, the emitter being in the form of a tube having an inner bore;
      ii. a magnet assembly having two ends, the magnet assembly being located within the inner bore of the emitter, the magnet assembly comprising a plurality of electromagnets, each electromagnet comprising an electrically conductive coil and a hollow core of magnetic material, the longitudinal axis of the coil and core lying along the longitudinal axis of the emitter and the core having a central portion around which the coil is located and two end portions connected to the central portion, the maximum outer diameter of each end portion being greater than the outer diameter of the central portion, the outer diameter of each end portion being equal to the outer diameter of the central portion at the connection of each end portion to the central portion and each end portion being tapered towards the central portion adjacent to the connection of each end portion to the central portion; at least one nonmagnetic spacing connector between neighboring electromagnets; and iii. at least one nonmagnetic end connector at each end of the magnet assembly;

b. positioning the emitter and magnet assembly of the emitter assembly within the workpiece so that the longitudinal axis of the emitter is coaxial with the longitudinal axis of the workpiece;

c. providing a low pressure environment containing a sputtering gas exterior to the emitter and interior to the workpiece;

d. creating a plasma field between the emitter and the workpiece; and e. creating a magnetic field around the emitter by flowing current through the electromagnets of the magnet assembly to create a magnetic flux which primarily exits the outer faces of the end portions of cores of the electromagnets.

5. The method of claim 4, wherein the magnet assembly is moved longitudinally relative to the emitter such that the magnet assembly moves back and forth over a selected travel distance.

6. The method of claim 5, wherein the selected travel distance is greater than the length of longest core in the assembly.

7. A method for applying a sputtered coating onto the exterior non-cylindrical surface of a hollow elongate workpiece, the workpiece having a longitudinal axis, the method comprising the steps of a. providing an emitter assembly, the emitter assembly comprising:

i. an elongate cylindrical emitter having a longitudinal axis, the emitter being in the form of a tube having an inner bore;

ii. a magnet assembly for providing a magnetic field exterior to the emitter, the magnet assembly having two ends and being located within the inner bore of the emitter, the magnet assembly comprising: at least one magnet unit, the magnet unit comprising at least one electromagnet, where the number of magnet units and the number of electromagnets in each magnet unit is selected so that the magnet assembly comprises a plurality of electromagnets; and at least one nonmagnetic spacing connector between neighboring electromagnets wherein each electromagnet comprises an electrically conductive coil and a hollow core of magnetic material, the longitudinal axis of the coil and core lying along the longitudinal axis of the emitter and the core having a central portion around which the coil is located and two end portions connected to the central portion, the maximum outer diameter of each end portion being greater than the outer diameter of the central portion, the outer diameter of each end portion being equal to the outer diameter of the central portion at the connection of each end portion to the central portion and each end portion being tapered towards the central portion adjacent to the connection of each end portion to the central portion;

iii. at least one adjustable source of electrical current, the number of current sources being equal to the number of magnet units, each current source being connected to a different magnet unit; and iv. at least one nonmagnetic end connector at each end of the magnet assembly;

b. placing the emitter so that the longitudinal axis of the emitter is parallel to the longitudinal axis of the workpiece;

c. providing a low pressure environment containing a sputtering gas exterior to the emitter and the workpiece;

d. rotating the workpiece around its longitudinal axis;

e. creating a plasma field between the emitter and the workpiece; and f. creating a magnetic field around the emitter by flowing current through the electromagnets of the magnet assembly to create a magnetic flux which primarily exits the outer faces of the end portions of the cores of the electromagnets, wherein the magnet assembly configuration and the current supplied to each magnet unit is selected to provide a magnetic field configuration compatible with the workpiece surface contour.

8. The method of claim 7, wherein the magnet assembly is moved longitudinally relative to the emitter such that the magnet assembly moves back and forth over a selected travel distance.

9. The method of claim 8, wherein the selected travel distance is greater than the length of the longest core in the assembly.

10. A method for applying a coating onto the exterior surface of an elongate workpiece, the workpiece having a longitudinal axis, the method comprising the steps of:

a. providing an emitter assembly, the emitter assembly comprising i. an elongate cylindrical emitter having a longitudinal axis, the emitter being in the form of a tube having an inner bore;

ii. a magnet assembly having two ends, the magnet assembly being located within the inner bore of the emitter, the magnet assembly comprising a plurality of electromagnets, each electromagnet comprising an electrically conductive coil and a hollow core of magnetic material, the longitudinal axis of the coil and core lying along the longitudinal axis of the emitter and the core having a central portion around which the coil is located and two end portions connected to the central portion, the maximum outer diameter of each end portion being greater than the outer diameter of the central portion, the outer diameter of each end portion being equal to the outer diameter of the central portion at the connection of each end portion to the central portion and each end portion being tapered towards the central portion adjacent to the connection of each end portion to the central portion; at least one nonmagnetic spacing connector between neighboring electromagnets; and iii. at least one nonmagnetic end connector at each end of the magnet assembly;

b. placing the emitter assembly so that the longitudinal axis of the emitter is parallel to the longitudinal axis of the workpiece;
c. providing a low pressure environment containing a sputtering gas exterior to the emitter and the workpiece;
d. rotating the workpiece around its longitudinal axis;
e. creating a plasma field between the emitter and the workpiece; and
f. creating a magnetic field around the emitter by flowing current through the electromagnets of the magnet to create a magnetic flux which primarily exits the outer faces of the end portions of the cores of the electromagnets.

11. The method of claim 10, wherein the magnet assembly is moved longitudinally relative to the emitter such that the magnet assembly moves back and forth over a selected travel distance.

12. The method of claim 11, wherein the selected travel distance is greater than the length of longest core in the assembly.

13. A method for applying a sputtered coating onto the interior and exterior surfaces of a hollow elongate workpiece, the workpiece having a longitudinal axis, the method comprising the steps of:
a. providing a first elongate emitter assembly, the first emitter assembly comprising
   i. an elongate cylindrical first emitter having a longitudinal axis, the first emitter being in the form of a tube having an inner bore;
   ii. a first magnet assembly having two ends, the first magnet assembly being located within the inner bore of the first emitter, the first magnet assembly comprising a plurality of electromagnets, each electromagnet of the first magnet assembly comprising an electrically conductive coil and a hollow core of magnetic material, the longitudinal axis of the coil and core lying along the longitudinal axis of the first emitter and the core having a central portion around which the coil is located and two end portions connected to the central portion, the maximum outer diameter of each end portion being greater than the outer diameter of the central portion, the outer diameter of each end portion being equal to the outer diameter of the central portion at the connection of each end portion to the central portion and each end portion being tapered towards the central portion adjacent to the connection of each end portion to the central portion; at least one nonmagnetic spacing connector between neighboring electromagnets; and
   iii. at least one nonmagnetic end connector at each end of the first magnetic assembly;
   wherein the first emitter assembly is positioned so that it is external to the workpiece with the longitudinal axis of the first emitter parallel to the longitudinal axis of the workpiece;
b. providing a second elongate emitter assembly; the second emitter assembly comprising
   i. an elongate cylindrical second emitter having a longitudinal axis, the second emitter being in the form of a tube having an inner bore;
   ii. a second magnet assembly having two ends, the second magnet assembly being located within the inner bore of the second emitter, the second magnet assembly comprising a plurality of electromagnets, each electromagnet of the second magnet assembly comprising an electrically conductive coil and a hollow core of magnetic material, the longitudinal axis of the coil and core lying along the longitudinal axis of the second emitter and the core having a central portion around which the coil is located and two end portions connected to the central portion, the maximum outer diameter of each end portion being greater than the outer diameter of the central portion, the outer diameter of each end portion being equal to the outer diameter of the central portion at the connection of each end portion to the central portion and each end portion being tapered towards the central portion adjacent to the connection of each end portion to the central portion; at least one nonmagnetic spacing connector between neighboring electromagnets; and
   iii. at least one nonmagnetic end connector at each end of the second magnetic assembly;
   wherein the second emitter and second magnet assembly of the second emitter assembly are positioned within the workpiece so that the longitudinal axis of the second emitter is coaxial with the longitudinal axis of the workpiece;
c. providing a low pressure environment containing a sputtering gas exterior to the first and second emitters and both interior and exterior to the workpiece;
d. rotating the workpiece about its longitudinal axis;
e. creating a first plasma field between the first emitter and the workpiece;
f. creating a second plasma field between the second emitter and the workpiece;
g. creating a first magnetic field around the first emitter by flowing current through the electromagnets of the first magnet assembly to create a first magnetic flux which primarily exits the outer faces of the end portions of the cores of the first magnet assembly; and
h. creating a second magnetic field around the second emitter by flowing current through the electromagnets of the second magnet assembly to create a second magnetic flux which primarily exits the outer faces of the end portions of the cores of the second magnet assembly.

14. A method for applying a sputtered coating onto the interior and exterior surfaces of a hollow elongate workpiece, the workpiece having a longitudinal axis, the method comprising the steps of
a. providing a first emitter assembly, the first emitter assembly comprising:
   i. an elongate cylindrical first emitter having a longitudinal axis, the first emitter being in the form of a tube having an inner bore;
   ii. a first magnet assembly for providing a magnetic field exterior to the first emitter, the first magnet assembly having two ends and being located within the inner bore of the first emitter, the first magnet assembly comprising: at least one magnet unit, the magnet unit comprising at least one electromagnet, where the number of magnet units and the number of electromagnets in each magnet unit is selected so that the first magnet assembly comprises a plurality of electromagnets; and at least one nonmagnetic spacing connector between neighboring electromagnets
   wherein each electromagnet of the first magnet assembly comprises an electrically conductive coil and a hollow core of magnetic material, the longitudinal axis of the coil and core lying along the longitudinal axis of the emitter and the core having a central portion around which the coil is located and two end portions connected to the central portion, the maximum outer diameter of each end portion being greater than the outer diameter of the central portion, the outer diameter of each end portion being equal to the outer diameter of the central portion at the connection of each end portion to the central portion and each end portion being tapered towards the central portion adjacent to the connection of each end portion to the central portion iii. at least one adjustable source of electrical current, the number of current sources being equal to the number of magnet units in the first magnet assembly, each current source being connected to a different magnet unit; and iv. at least one nonmagnetic end connector at each end of the first magnet assembly;

wherein the first emitter assembly is positioned so that it is external to the workpiece with the longitudinal axis of the first emitter parallel to the longitudinal axis of the workpiece;

b. providing a second emitter assembly, the second emitter assembly comprising:

i. an elongate cylindrical second emitter having a longitudinal axis, the second emitter being in the form of a tube having an inner bore;

ii. a second magnet assembly for providing a magnetic field exterior to the second emitter, the second magnet assembly having two ends and being located within the inner bore of the second emitter, the second magnet assembly comprising: at least one magnet unit, the magnet unit comprising at least one electromagnet, where the number of magnet units and the number of electromagnets in each magnet unit is selected so that the second magnet assembly comprises a plurality of electromagnets; and at least one nonmagnetic spacing connector between neighboring electromagnets wherein each electromagnet of the second magnet assembly comprises an electrically conductive coil and a hollow core of magnetic material, the longitudinal axis of the coil and core lying along the longitudinal axis of the emitter and the core having a central portion around which the coil is located and two end portions connected to the central portion, the maximum outer diameter of each end portion being greater than the outer diameter of the central portion, the outer diameter of each end portion being equal to the outer diameter of the central portion at the connection of each end portion to the central portion and each end portion being tapered towards the central portion adjacent to the connection of each end portion to the central portion;

iii. at least one adjustable source of electrical current, the number of current sources being equal to the number of magnet units in the second magnet assembly, each current source being connected to a different magnet unit; and iv. at least one nonmagnetic end connector at each end of the second magnet assembly;

wherein the second emitter and second magnet assembly of the second emitter assembly are positioned within the workpiece so that the longitudinal axis of the second emitter is coaxial with the longitudinal axis of the workpiece;

c. providing a low pressure environment containing a sputtering gas exterior to the first and second emitters and both interior and exterior to the workpiece;

d. rotating the workpiece about its longitudinal axis;

e. creating a first plasma field between the first emitter and the workpiece;

f. creating a second plasma field between the second emitter and the workpiece;

g. creating a first magnetic field around the first emitter by flowing current through the electromagnets of the first magnet assembly to create a first magnetic flux which primarily exits the outer faces of the end portions of the cores of the first magnet assembly, wherein the current supplied to each magnet unit of the first magnet assembly and the first magnet assembly configuration of the first emitter assembly are selected to provide a magnetic field configuration compatible with the external workpiece surface contour; and h. creating a second magnetic field around the second emitter by flowing current through the electromagnets of the second magnet assembly to create a second magnetic flux which primarily exits the outer faces of the end portions of the cores of the second magnet assembly, wherein the current supplied to each magnet unit of the second magnet assembly and the second magnet assembly configuration of the second emitter assembly are selected to provide a magnetic field configuration compatible with the internal workpiece surface contour.

15. The method of claim 1 wherein the electromagnets are arranged in series and in step e) lines of the magnetic flux are formed between adjacent core ends.

16. The method of claim 4, wherein the electromagnets are arranged in series and in step e) lines of the magnetic flux are formed between adjacent core ends.

17. The method of claim 7, wherein the electromagnets are arranged in series and in step f) lines of the magnetic flux are formed between adjacent core ends.

18. The method of claim 10, wherein the electromagnets are arranged in series and in step f) lines of the magnetic flux are formed between adjacent core ends.

19. The method of claim 13 wherein the electromagnets of the first magnet assembly are arranged in series and in step g) lines of the first magnetic flux are formed between adjacent core ends of the electromagnets of the first magnet assembly and the electromagnets of the second magnet assembly are arranged in series and in step h) lines of the second magnetic flux are formed between adjacent core ends of the electromagnets of the second magnet assembly.

20. The method of claim 14 wherein the electromagnets of the first magnet assembly are arranged in series and in step g) lines of the first magnetic flux are formed between adjacent core ends of the electromagnets of the first magnet assembly and the electromagnets of the second magnet assembly are arranged in series and in step h) lines of the second magnetic flux are formed between adjacent core ends of the electromagnets of the second magnet assembly.

21. The method of 1 wherein the electromagnets are arranged in parallel.

22. The method of 4 wherein the electromagnets are arranged in parallel.

23. The method of 7 wherein the electromagnets are arranged in parallel.

24. The method of 10 wherein the electromagnets are arranged in parallel.

25. The method of 13 wherein the electromagnets of the first and second magnet assemblies are arranged in parallel.

26. The method of 14 wherein the electromagnets of the first and the second magnet assemblies are arranged in parallel.

* * * * *